United States Patent [19]

Roche

[11] 4,307,150
[45] Dec. 22, 1981

[54] WEATHERABLE SOLAR REFLECTOR

[75] Inventor: John L. Roche, St. Paul, Minn.

[73] Assignee: Minnesota Mining and Manufacturing Company, St. Paul, Minn.

[21] Appl. No.: 66,009

[22] Filed: Aug. 13, 1979

[51] Int. Cl.³ .............................................. B32B 15/08
[52] U.S. Cl. .................................... 428/336; 428/458; 428/480; 428/461; 428/520; 428/913; 428/463
[58] Field of Search ............... 428/480, 458, 463, 461, 428/913, 520, 220, 336

[56] References Cited

U.S. PATENT DOCUMENTS

| | | | |
|---|---|---|---|
| 3,458,348 | 7/1969 | Sherman | 428/422 |
| 4,011,358 | 3/1977 | Roelfs | 428/287 |
| 4,066,820 | 1/1978 | Kelly et al. | 428/520 |
| 4,157,417 | 6/1979 | Murphy | 428/463 |

Primary Examiner—Marion McCamish
Assistant Examiner—E. Rollins Buffalow
Attorney, Agent, or Firm—Cruzan Alexander; Donald M. Sell; Richard E. Brink

[57] ABSTRACT

Solar reflector comprising an opaque, specular metalized polymeric foil protected from corrosion and weathering by a layer of an interpolymer of (1) lower acrylate and/or methacrylate monomers and (2) minor amounts of ethylenically unsaturated lower carboxylic acid monomers.

6 Claims, No Drawings

WEATHERABLE SOLAR REFLECTOR

This invention relates to solar reflectors and to metalized sheets having particular utility in making such reflectors.

BACKGROUND OF THE INVENTION

In solar energy collecting devices, planar or curved specular surfaces are commonly arranged to direct the sun's rays to a desired location, e.g., toward a tube containing water. The effectiveness of this type of device depends heavily on the efficiency of reflection, and it is essential that the reflecting surfaces maintain as high a degree of specularity as possible. One way of attaining a high degree of specularity is through vapor-deposition of suitable metals—e.g., gold, silver, copper, or especially, because of its low cost and ease of application, aluminum—on the surface of a smooth polymeric foil. The metalized foil is then either adhered to a planar or suitably contoured surface or, alternatively, mounted or gripped at the edges and a vacuum applied to the center to generate a parabolic surface.

When metalized foils of the type just described are exposed to normal atmospheric conditions, the dew, rain, heat, and abrasion deluster, corrode, oxidize and transparentize certain portions of the originally specular surface. While it might seem reasonable to apply a thin layer of a suitable transparent protective material over the surface of the metal, it is believed that, prior to the present invention, this has never been accomplished successfully. Some polymeric coatings applied to the metal surface aggravate the corrosion process, either because the pH of the coating is initially too far removed from neutral or because corrosive by-products are eliminated from the coating as it ages. Other coatings, which are capable of maintaining satisfactory neutrality over long periods of time, either adhere poorly to the surface of the metal or, for reasons that are not completely clear, cause the metal to separate from the polymeric foil backing.

SUMMARY

The present invention provides an improved solar reflector of the type comprising a flexible support sheet having a smooth face and an opaque, specular metallic layer firmly bonded thereto. Over the metallic surface is firmly adherently bonded a thin, transparent weather-resistant protective, polymeric layer which comprises an interpolymer of monomers consisting essentially of (a) 98.0–99.5% of acrylic ester monomers selected from the class consisting of lower acrylates and lower methacrylates and (b) 2.0–0.5% of carboxylic acid monomers selected from the class consisting of acrylic acid, methacrylic acid, itaconic acid, and maleic acid.

The invention also encompasses sheet material particularly adapted for making reflectors of the type just described, comprising a polyester foil having first and second surfaces, with a normally tacky and pressure-sensitive adhesive bonded to the first surface and an opaque, specular layer of at least 99.98% pure aluminum vapor-deposited on the second surface. Firmly adherently bonded to the aluminum layer is a coating which is an interpolymer of monomers consisting essentially of about 50–70% monomers selected from the class consisting of methyl methacrylate and ethyl methacrylate, about 30–50% monomers selected from the class consisting of butyl acrylate, butyl methacrylate and 2-ethyl hexylacrylate and 0.5–2.0% carboxylic acid selected from the class consisting of acrylic acid and methacrylic acid. A pressure-sensitive adhesive may be applied to the opposite face of the polyester foil.

DESCRIPTION OF A PREFERRED EMBODIMENT

In the following example, all parts are by weight unless otherwise noted.

A 50-micrometer co-extruded biaxially oriented polyester foil was obtained, the foil consisting of (1) a 38-micrometer polyethylene terephthalate lamina containing conventional slip agents and hence having a mildly irregular surface to facilitate winding and (2) a 12-micrometer polyethylene terephthalate lamina containing no slip agent and hence having an exposed surface which was essentially optically smooth. On the smooth surface was then vapor-deposited 0.08–0.1-micrometer of a high purity (99.88+%) aluminum to provide an opaque specular metallic surface. Using reverse roll coating techniques, a 20% toluene solution of an acrylic polymer, believed to be a 62.4:36.2:1.4 methylmethacrylate:butyl acrylate:acrylic acid terpolymer, commercially available from Rohm & Haas under the trade designation "B-48N", was applied and the solvent evaporated by drying in a 105° C. oven for 4 minutes to leave a dry coating weighing approximately 5 g/m$^2$.

To determine whether the adhesion between the aluminum and copolyester and the adhesion between the acrylic coating and the aluminum were both adequate, a simple test was performed. Using a straightedge and a razor blade, the coated surface was crosshached wih lines drawn every 6.4 mm. A commercially available pressure-sensitive adhesive tape product, having a cellulose acetate foil backing and a 95.5:4.5 iso-octyl acrylate:acrylic acid copolymer adhesive, was then applied over the crosshatched surface and rubbed down to ensure uniform contact. The tape was then doubled back on itself at 180° and removed by hand at estimated rates of 2.5 to 25 cm/sec. It was found that the tape stripped free cleanly, and no separation occurred at either the interface between the smooth polyester lamina and the aluminum or the interface between the acrylic coating and the aluminum.

The ability of the product to withstand outdoor exposure was then evaluated in accordance with ASTM Test No. G53-77, an accelerated weathering test in which the sample was continuously subjected to a temperature of 50° to 60° C. at relative humidity in excess of 90%, ultraviolet light (280–350 nanometers) being directed onto the coated surface at an intensity of approximately 500 watts/m$^2$ for 4-hour periods alternating with 4-hour periods of darkness. A product is considered to be satisfactory for outdoor use if it displays no evidence of metal corrosion or coating opacification after 2000 hours of testing. The product of this example appeared to be unchanged at the end of this test.

For some purposes, it has been found desirable to provide a means for adhering the reflective sheeting to various substrates. Accordingly, the uncoated (polyester) surface of the product of this example was coated with a 25% methylethyl ketone solution of a 95:5 iso-octyl acrylate:acrylamide copolymer and the solvent evaporated in a 93° C. oven for 5 minutes to leave a dried adhesive coating weighing approximately 32 g/m$^2$. The product was then wound in roll form, a silicone-coated release liner being interleaved between adjacent convolutions to prevent the adhesion from adhering to the acrylate coating. The roll could then be readily unwound and the adhesive used to mount the reflective sheeting on a desired substrate.

Numerous variations of the invention will readily occur to those skilled in the art. For example, the silicone release liner can be eliminated if a dilute solution of water-soluble polymer (e.g., polyvinyl alcohol or methyl cellulose) is applied over the pressure-sensitive adhesive and the solvent evaporated to leave a thin detackifying coating which can be washed off just before application.

Where large-area reflectors are to be prepared, sheets of the reflective material can be abutted and a strip of pressure-sensitive adhesive tape applied to one or both surfaces. It will be appreciated, of course, that seaming tape applied to the reflective surface should be reflective itself; such tape can be prepared by slitting the previously described material into narrow widths. Because such tape may be subjected to considerable shearing stress, it is desirable to use a harder, less compliant adhesive, e.g., a 50:40:10 iso-octyl acrylate:ethyl acrylate:acrylic acid terpolymer crosslinked with 1.26% benzoyl peroxide.

What is claimed is as follows:

1. A solar reflector comprising a flexible support sheet having a smooth face, an opaque, specular metallic layer, on the order of at least 0.08 to 0.1 micrometer thick, firmly bonded to said face, and a thin, transparent weather-resistant protective polymeric layer bonded to said metallic layer so as to be exposed to the environment, said polymeric layer comprising an interpolymer of monomers consisting essentially of (a) 98.0–99.5% of acrylic ester monomers selected from the class consisting of lower acrylates and lower methacrylates and (b) 2.0–0.5% of carboxylic acid monomers selected from the class consisting of acrylic acid, methacrylic acid, itaconic acid and maleic acid.

2. The reflector of claim 1 wherein the support comprises a biaxially oriented polymeric foil.

3. The reflector of claim 1 wherein the support is a biaxially oriented co-extruded composite comprising a first polyester lamina which contains slip agent and, at one face, a second polyester lamina free from slip agent, the metallic layer being bonded to said second lamina.

4. The reflector of claim 1, 2 or 3 wherein the metallic layer is at least 99.98% pure aluminum.

5. The reflector of claim 4 wherein the acrylic ester monomers are selected from the class consisting of methyl acrylate, ethyl acrylate, butyl acrylate, 2-ethyl hexyl acrylate, methyl methacrylate, ethyl methacrylate and butyl methacrylate.

6. A sheet material particularly adapted for making the reflector of claim 5 comprising a polyester foil having first and second surfaces,
   (a) a normally tacky and pressure-sensitive adhesive bonded to said first surface;
   (b) an opaque specular layer of at least 99.98% pure aluminum, on the order of at least 0.08 to 0.1 micrometer thick, vapor-deposited on said second surface;
   (c) firmly adherently bonded to said aluminum layer and constituting an exposed surface of said sheet material, a coating of an interpolymer of monomers consisting essentially of
      (1) about 50 to 70% monomers selected from the class consisting of methyl methacrylate and ethyl methacrylate;
      (2) about 30 to 50% monomers selected from the class consisting of butyl acrylate, butyl methacrylate and 2-ethyl hexyl acrylate and
      (3) 0.5 to 2.0% carboxylic acid selected from the class consisting of acrylic acid and methacrylic acid.

* * * * *